(12) United States Patent
Fang et al.

(10) Patent No.: US 6,228,782 B1
(45) Date of Patent: May 8, 2001

(54) CORE FIELD ISOLATION FOR A NAND FLASH MEMORY

(75) Inventors: Hao Fang, Cupertino; Massaki Higashitani, Sunnyvale; Narbeh Derhacobian, Belmont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/309,994

(22) Filed: May 11, 1999

(51) Int. Cl.$^7$ .................................................. H01L 21/336
(52) U.S. Cl. .......................... 438/981; 438/258; 257/326
(58) Field of Search ................................... 438/258, 406, 438/981; 257/329

(56) References Cited

U.S. PATENT DOCUMENTS

| | | | |
|---|---|---|---|
| 4,675,982 | * 6/1987 | Noble et al. ........................... | 438/981 |
| 4,743,563 | * 5/1988 | Pfiester et al. ....................... | 438/981 |
| 4,847,213 | * 7/1989 | Pfiester ............................... | 438/981 |
| 4,971,923 | * 11/1990 | Nakanishi ............................ | 438/981 |
| 5,045,491 | * 9/1991 | Gill et al. ............................. | 438/981 |
| 5,061,654 | * 10/1991 | Shimizu ............................... | 438/981 |
| 5,147,816 | * 9/1992 | Gill et al. ............................. | 438/981 |
| 5,372,951 | * 12/1994 | Anjum et al. ........................ | 438/981 |
| 5,472,892 | * 12/1995 | Gwen et al. .......................... | 438/258 |
| 5,512,504 | * 4/1996 | Wolstenholme et al. ............ | 438/258 |
| 5,656,527 | * 8/1997 | Choi et al. ........................... | 438/258 |
| 5,674,762 | * 10/1997 | See et al. ............................. | 438/258 |
| 5,789,293 | * 8/1998 | Cho et al. ............................. | 438/258 |
| 5,798,279 | * 8/1998 | Crisenza et al. ..................... | 438/258 |
| 5,923,975 | * 7/1999 | Rolandi ................................ | 438/258 |

OTHER PUBLICATIONS

Stanley Wolf Silicon Processing for the VSLI Era vol. 1 Lattice Press pp. 207–208, 1986.*
Stanley Wolf Silicon Processing for the VSLI Era vol. 2 Lattice Press p. 331 1990.*

* cited by examiner

*Primary Examiner*—Charles Bowers
*Assistant Examiner*—David S Blum

(57) ABSTRACT

Selective high-energy impurity implantation enables optimization of both core and peripheral field isolation without substantially degrading functionality, self-boosting efficiency or otherwise increasing program disturb, thereby improving device performance and reliability. Embodiments include high-energy impurity implantation, after forming core and peripheral field oxide regions in a semiconductor substrate, into the peripheral field oxide region and selected portions of the core field oxide regions corresponding to select transistor areas, while blocking the implant from the core memory cell channel regions. A channel stop implant is performed through the core field oxide regions after etching a first polysilicon layer. The high-energy impurity implant optimizes peripheral field isolation, without degrading self-boosting efficiency, because it is blocked from entering the memory cell channel region. The high-energy implant also enhances isolation in the select transistor areas, thereby preventing an increase in device malfunctions, while the channel stop implant optimizes core field isolation.

26 Claims, 21 Drawing Sheets

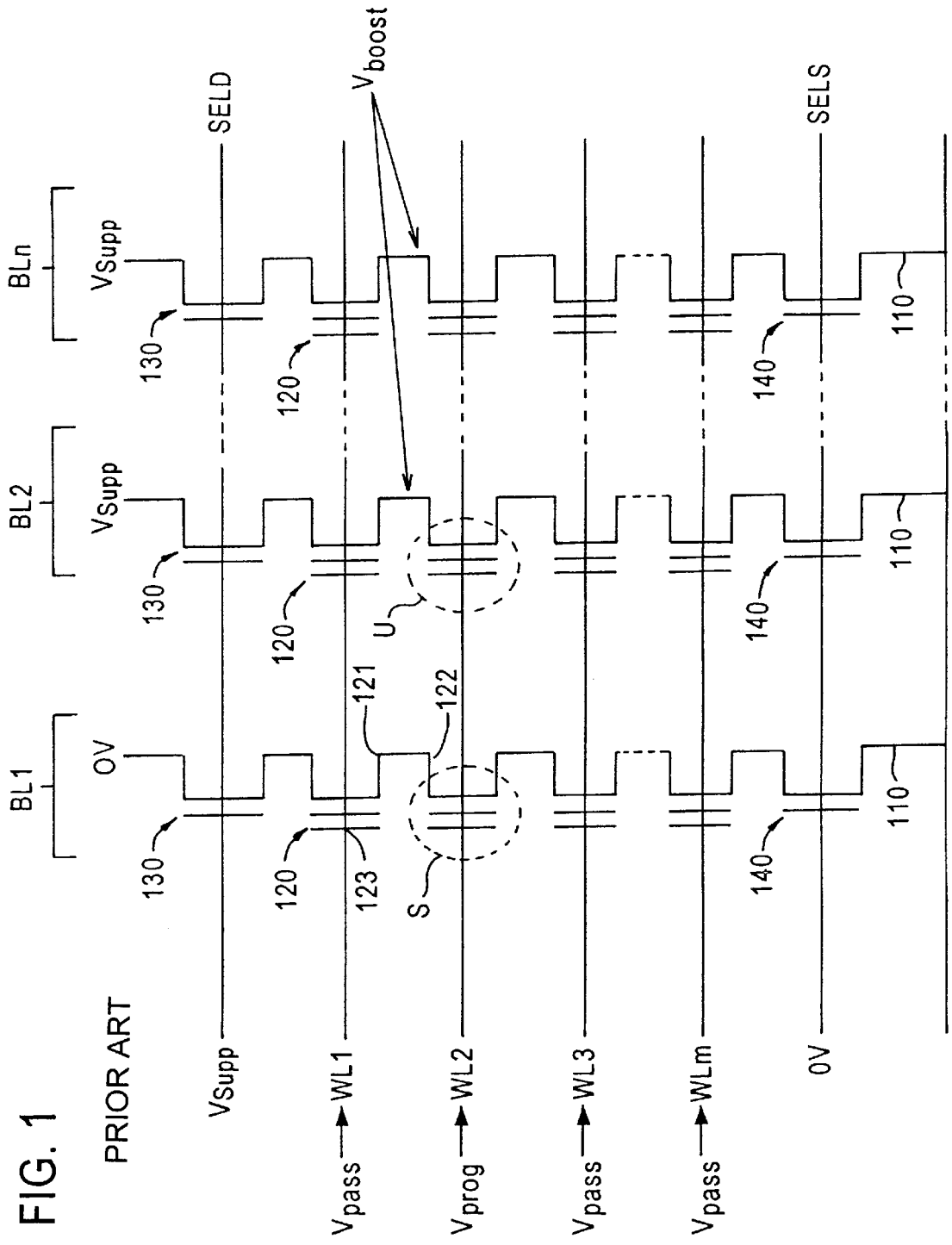

CORE FIELD ISOLATION FOR A NAND FLASH MEMORY

FIELD OF THE INVENTION

The present invention relates to a method of manufacturing a memory device on a semiconductor substrate. The present invention has particular applicability in manufacturing nonvolatile semiconductor memory devices having high quality field isolation.

BACKGROUND ART

Conventional nonvolatile semiconductor memories, such as flash electrically erasable programmable read only memories (flash EEPROMs), typically comprise a floating gate memory cell, which includes a source region, a drain region and a channel region formed in a semiconductor substrate, and a floating gate formed above the substrate between the channel region and a control gate. A voltage differential is created in the cell when a high voltage is applied to the control gate while the channel region is kept at a low voltage, causing injection of electrons from the channel region into the floating gate, as by tunneling, thereby charging the floating gate. This movement of electrons is referred to as programming, and the high voltage (i.e., about 18 volts) applied to the control gate is known as program voltage.

A typical architecture for a flash memory system, referred to as a NAND architecture, is depicted in FIG. 1. The NAND architecture includes several strings 110, known as NAND strings, of floating gate memory transistors (or "memory cells") 120, each transistor 120 coupled to the next transistor 120 in the string 110 by coupling the source 121 of one transistor 120 to the drain 122 of the next transistor 120. At either end of each string 110 is a selection transistor, one of which is referred to as a select drain transistor 130, and the other of which is referred to as a select source transistor 140. Each NAND string 110 and its associated pair of selection transistors 130, 140 is known as a bit line BL1–BLn. A plurality of word lines WL1–WLm, perpendicular to the NAND strings 110, each connect to the control gate 123 of one memory cell 120 of each NAND string 110. A line SELD connects the gates of the select drain transistors 130, and a line SELS connects the gates of the select source transistors 140. Peripheral devices, such as power transistors (not shown) supply voltages of up to 23 volts for programming and other functions of the memory system.

FIG. 2A depicts a typical floating gate memory cell 120, which includes source/drain regions 220 and channel region 230 formed in substrate 210, such as by implantation of impurities, tunnel oxide 240 of about 95 Å, polysilicon floating gate 250, dielectric layer 260 and polysilicon control gate 270.

FIG. 2B depicts a typical selection transistor 130, 140, which includes source/drain regions 221 and channel region 231 formed in substrate 210, as by implantation of impurities, and gate oxide 241 of about 180 Å. Polysilicon floating gate 250, dielectric layer 260 and polysilicon control gate 270 are formed simultaneously with the corresponding parts of the floating gate memory cells 120. Floating gate 350 and control gate 270 are then short circuited together by contact 280 to form the selection transistor's gate 290.

The NAND flash memory system described above is typically manufactured on semiconductor substrate 210 as illustrated in FIGS. 3A–3C. Initially, as depicted in FIG. 3B, field isolation regions 310, 330 are formed, as by local oxidation of silicon (LOCOS), for the memory core (i.e., the array of memory cells 120 and selection transistors 130, 140 which will be formed in core channel areas 320), and for peripheral circuitry, which will be formed in areas 321. As shown in FIG. 3A, the core field oxide regions 310 are typically formed as parallel rows separated by channel areas 320. Core field oxide 310 typically has a thickness of about 2000 Å to about 3000 Å to achieve small memory cell size and maintain the integrity of tunnel oxide 240. A thicker field oxide 330 of about 4000 Å to about 6000 Å is typically used in the peripheral circuit area to meet the high voltage isolation and gate oxide reliability requirements of the peripheral devices.

The current demands for miniaturization into the deep submicron range for increased circuit density require optimization of memory cell isolation and peripheral circuit isolation to maintain the performance of the flash memory system. Due to the different thicknesses of the core field oxide 310 and the peripheral field oxide 330, optimization of the field isolation is complex. Peripheral field isolation is typically achieved by performing a high-energy boron implant B1 (e.g., about $5\times10^{12}$ atoms cm$^{-2}$ at about 120–180 keV) through the field oxide 310, 330 after a mask 340 is formed over portions of substrate 210, to implant the dopant into substrate 210 immediately below the peripheral field oxide 330 (see plus signs representing dopant). However, this single high-energy implant is not suitable for optimizing isolation of both the flash memory core and its peripheral circuitry, since the impurities are driven too far into the substrate under the thinner core field oxide 310 to sufficiently enhance isolation, as depicted at the left side of FIG. 3B. Thus, a separate implantation step must be performed to optimize the core field isolation. As shown in FIG. 3C, after gates 240, 241 are formed, and a polysilicon layer 350 (used to form gate 250 in core transistors 120, 130, 140) has been deposited, masked by mask 360, and etched, an implant B2, such as boron at about $10^{13}$ atoms cm$^{-2}$ and about 80 keV, called a "channel stop implant", is introduced into the core region immediately below core field oxide 310 to optimize core field isolation.

Referring again to FIG. 1, in the operation of a NAND flash memory, a problem arises when it is desired to program one selected cell S on a word line without programming other cells on the same word line. When program voltage Vprog is applied to a word line such as WL2, that voltage is applied not only to the selected cell S but also to the cells along the same word line which are unselected for programming. An unselected cell U on the word line, especially a cell adjacent to the selected cell S, may become inadvertently programmed. The unintentional programming of an unselected cell in a selected word line is referred to as "program disturb".

A well-known technique called "self-boosting" is typically employed to prevent program disturb, wherein the unselected bit lines BL2–BLn are electrically isolated and a pass voltage Vpass, such as about 10 volts, is applied to the unselected word lines WL1, WL3–WLm during programming. The unselected word lines capacitively couple to the unselected bit lines, causing a voltage Vboost, such as about 8 volts, to exist on the unselected bit lines, which tends to lower the voltage across the tunnel oxide and, hence, reduce program disturb.

The efficiency of the self-boosting technique (i.e., the value of Vboost) is directly related to the doping profile of the core memory cell channel regions; i.e., the portion of channel areas 320 between the core field oxide 310 on which floating gate memory cells 120 are formed. Boosting efficiency is enhanced if memory cell channel areas 320 are lightly and shallowly doped, and boosting efficiency is decreased if memory cell channel areas 320 are heavily and deeply doped. Disadvantageously, the conventional blanket high-energy implant B1 employed to optimize the peripheral field isolation results in the entirety of core channel areas 320 being deeply and heavily doped, which significantly reduces boosting efficiency by allowing current leakage to occur between bit lines. This tends to increase program disturb, thereby degrading the performance and reliability of the finished device.

There exists a need for a NAND flash memory methodology enabling optimization of core and peripheral field isolations without unduly degrading self-boosting efficiency, thereby improving device performance and reliability.

SUMMARY OF THE INVENTION

An advantage of the present invention is a method of manufacturing a NAND flash memory with substantially optimized core and field isolation and high self-boosting efficiency.

According to the present invention, the foregoing and other advantages are achieved in part by a method of manufacturing a semiconductor device, which method comprises forming a core field oxide in a memory core region on a semiconductor substrate and forming a peripheral field oxide in a peripheral region on the semiconductor substrate peripheral to the memory core region. An implant blocking mask is provided covering the memory core region and having openings exposing the peripheral field oxide and predetermined portions of the core field oxide, and a high-energy implantation of impurities into the substrate is performed through the openings in the implant blocking mask to improve field isolation. Gate and tunnel oxides are thereafter formed, a polysilicon layer is deposited, masked and etched, and a channel stop implant performed.

Another aspect of the present invention is a method of manufacturing a semiconductor device, which method comprises forming the core and peripheral field oxide, forming the gate and tunnel oxide, and depositing the polysilicon layer before forming the implant blocking mask and performing the high-energy implant.

A still further aspect of the present invention is a method of manufacturing a semiconductor device, which method comprises forming the core and peripheral field oxide, forming the gate and tunnel oxide, depositing, masking and etching the polysilicon layer, performing the channel stop implant and depositing, masking and etching a dielectric layer before forming the implant blocking mask and performing the high-energy implant.

The objects and advantages of the present invention may be realized and obtained as particularly pointed out in the appended claims. Additional objects and advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 1 is a schematic diagram of a NAND flash memory system.

DESCRIPTION OF THE INVENTION

Conventional methodologies for optimizing core and peripheral field isolations during NAND flash memory manufacture result in devices with low self-boosting efficiency and a high incidence of program disturb. The present invention addresses and solves these problems stemming from conventional manufacturing processes.

According to the present invention, core and peripheral field oxide regions are initially formed in a semiconductor substrate. As used throughout the present disclosure and claims, the term "substrate" denotes a semiconductor substrate or an epitaxial layer formed on the semiconductor substrate. A high-energy implantation of impurities is performed after formation of core and peripheral field oxide regions in order to optimize peripheral field isolation. However, the high-energy impurity implantation is strategically blocked from the core memory cell channel regions to preserve self-boosting efficiency. At the same time, selected portions of the core field oxide regions corresponding to the select transistor areas are exposed to the high-energy impurity implantation, for enhanced isolation. Core field isolation optimization is accomplished by performing a conventional channel stop implant through the core field oxide regions after forming and etching the first polysilicon layer. Thus, core and peripheral field isolations are accomplished without exposing the core memory cell region to a deep, heavy implant that would reduce self-boosting efficiency, and without adding any additional process steps.

Figure 4:
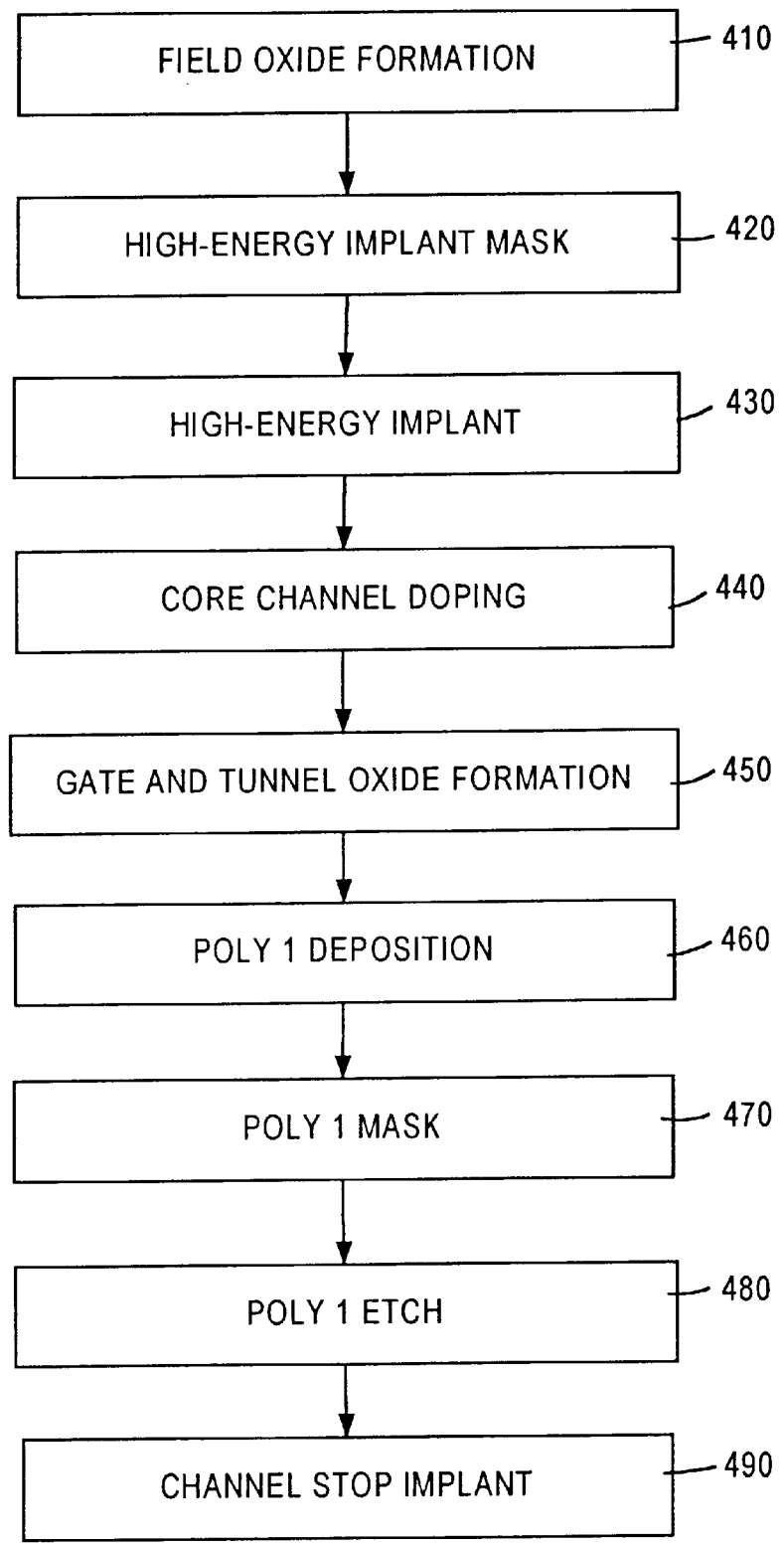
FIG. 4 is a flow chart illustrating sequential steps of a method in accordance with an embodiment of the present invention.
Figure 5A:
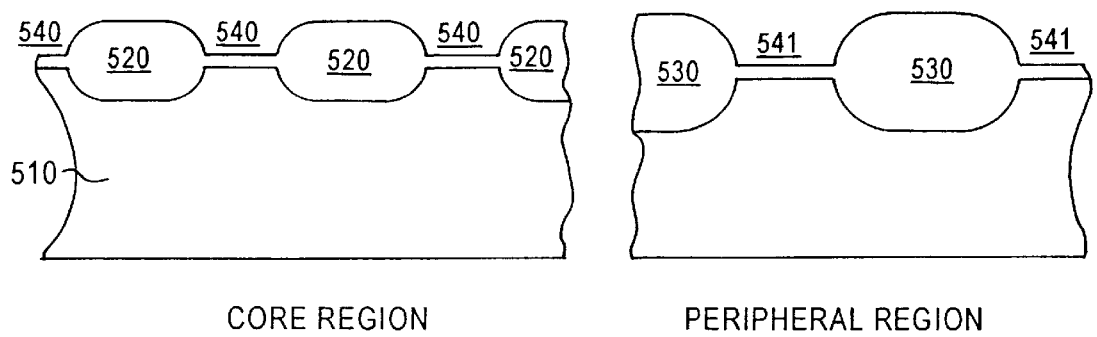
FIGS. 5A–5I schematically illustrate sequential phases of a method in accordance with an embodiment of the present invention.
Figure 5B:
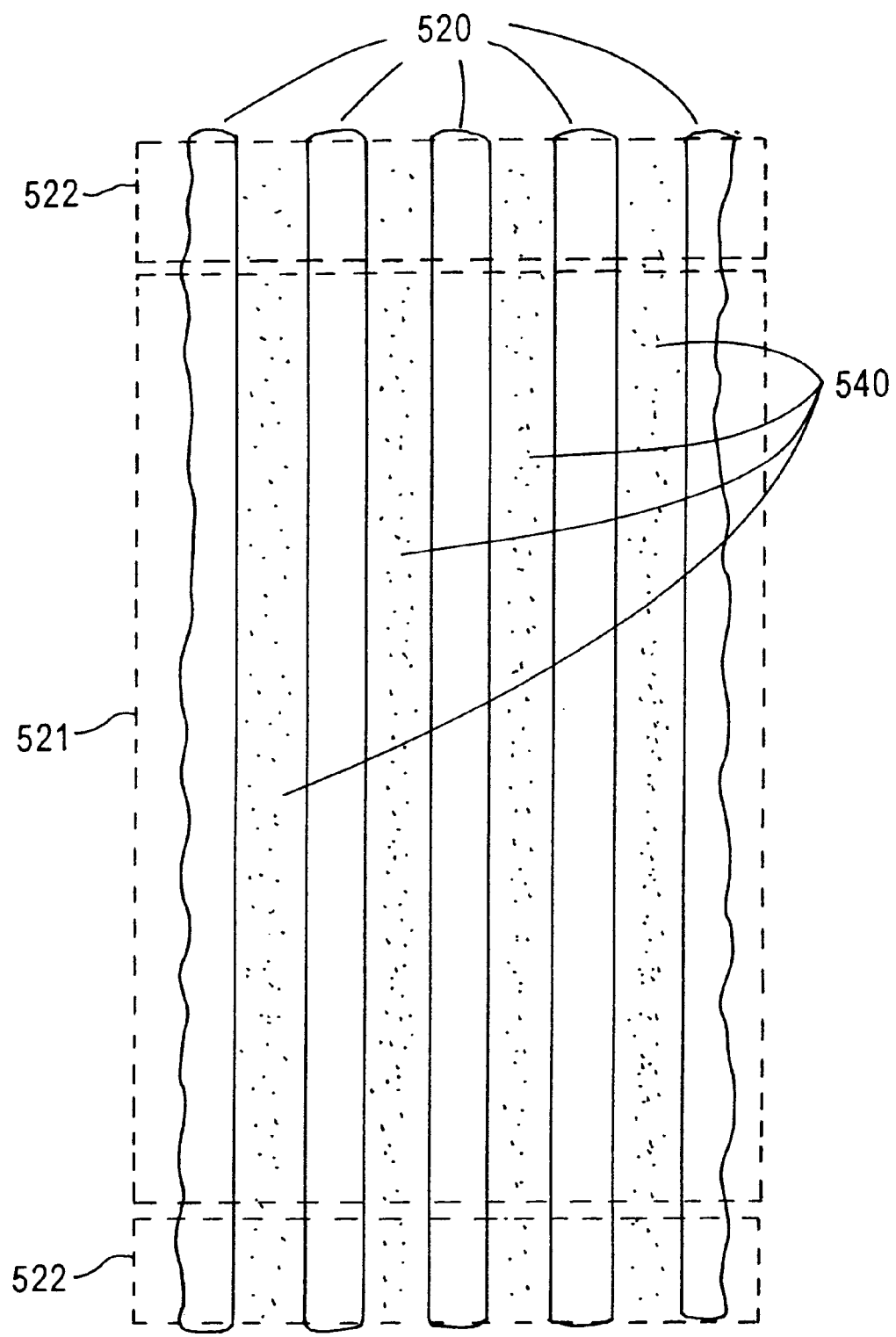

FIG. 4 is a flow chart illustrating sequential steps of a method in accordance with an embodiment of the present invention wherein the high-energy implantation of impurities is performed immediately after formation of core and peripheral field oxide regions. FIGS. 5A–5I schematically illustrate sequential phases of a method in accordance with this embodiment of the present invention. As depicted in FIGS. 5A and 5B, at step 410 field isolation regions 520, 530 are formed in substrate 510, as by a conventional dual LOCOS process, for the memory core and for peripheral circuitry, respectively, which will be formed in channel areas 540, 541. Core field oxide 520 is formed as a plurality of substantially parallel, substantially rectangular rows to define a central memory cell area 521 and a pair of select transistor areas 522 at each of an upper distal end portion of each row, and at a lower distal end portion of each row, corresponding to memory cells 120 and select transistors 130, 140 depicted in FIG. 1. Field oxide 520 in the memory core is grown to a thickness of about 2000 Å to about 3000 Å, and peripheral field oxide 340 is grown to about 4000 Å to about 6000 Å.

Figure 5C:
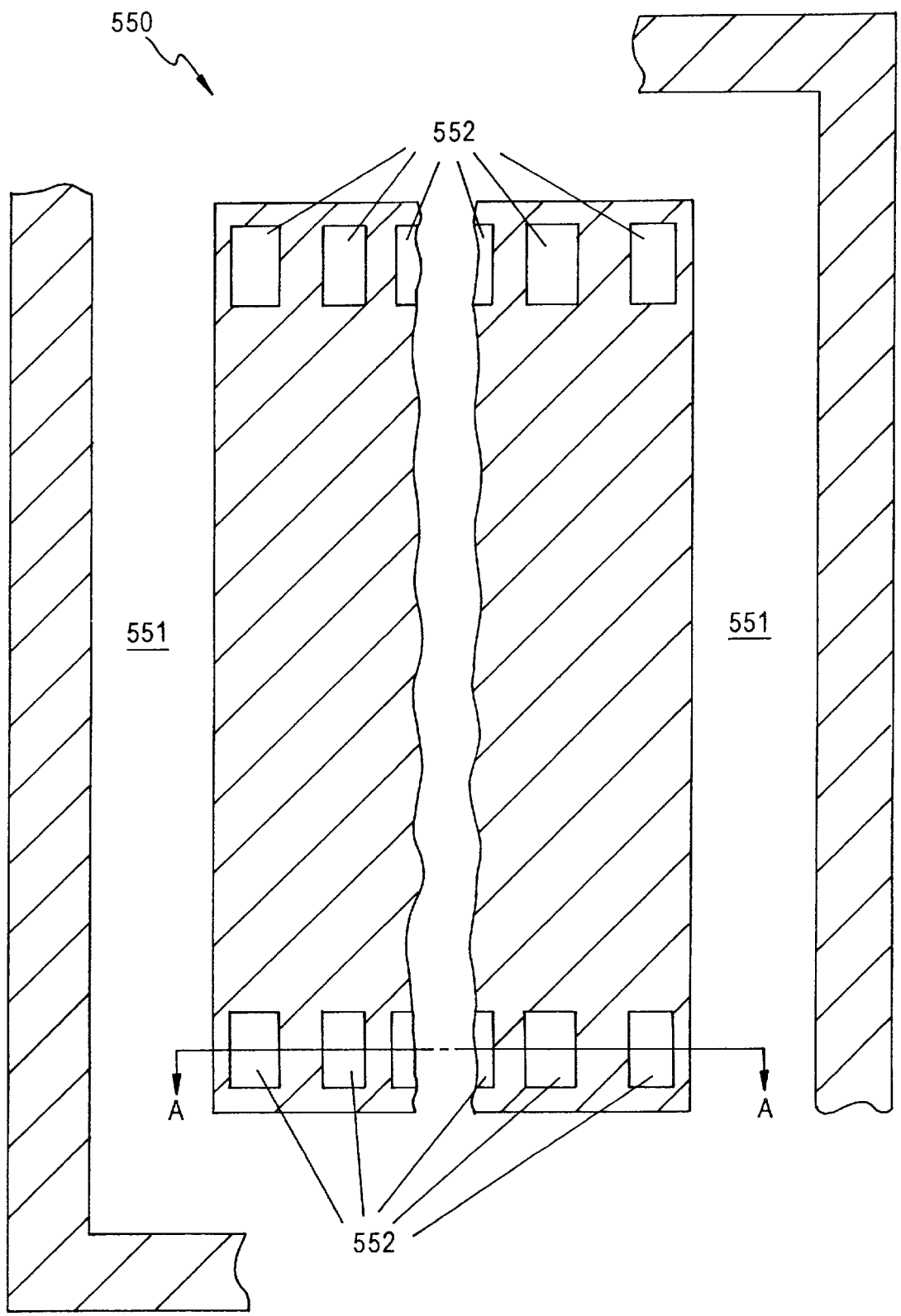
Figure 5D:
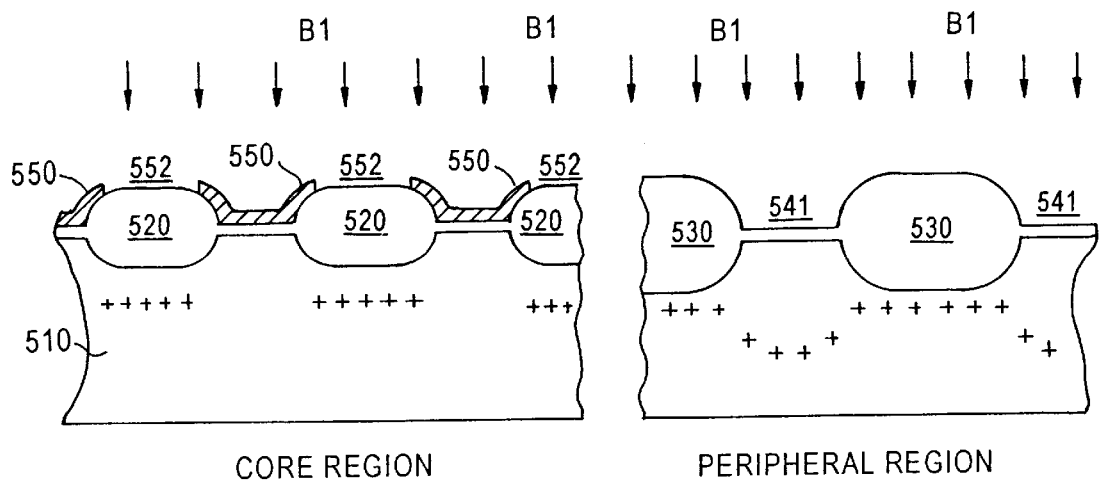

Next, at step 420, a photoresist mask 550 is formed on substrate 510, as depicted in FIG. 5C and FIG. 5D, which is a cross-sectional view taken through the line A—A in FIG. 5C. Mask 550 covers most of core field oxide 520, and has openings 551 to expose peripheral field oxide 530 and openings 552 to expose selected portions of the core field oxide 520 corresponding to the select transistor areas 522; i.e., the distal end portions of each of the rows of core field oxide 520. A high-energy implant B1 is then performed (step 430), such as boron at a dosage of about $5 \times 10^{12}$ atoms cm$^{-2}$ at an energy of about 120–180 keV, to optimize the peripheral field isolation and to enhance isolation at the select transistor areas 522.

Figure 5E:
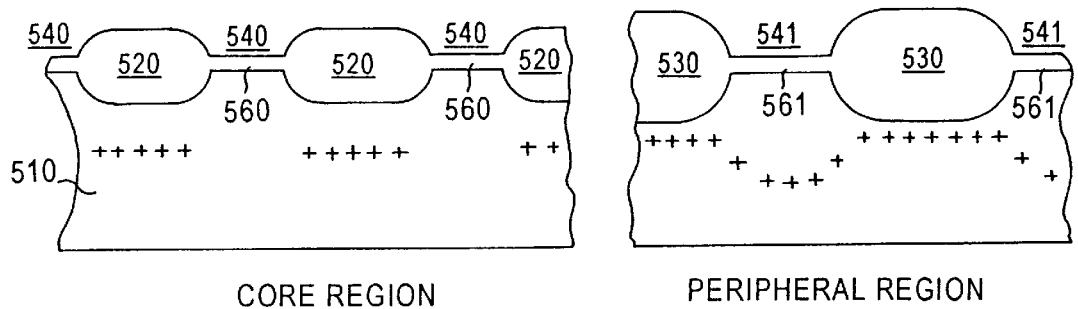
Figure 5F:
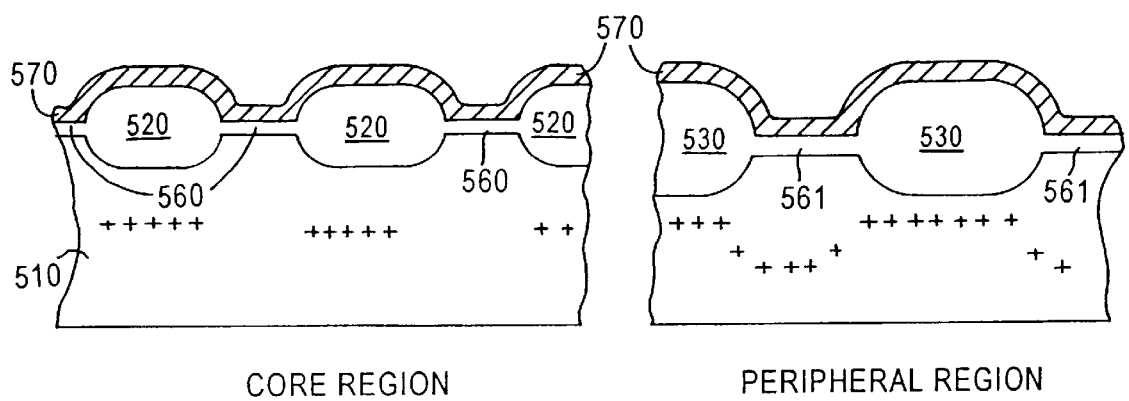

Core channel regions (not shown) are thereafter doped at step 440 in substrate 510 by forming a threshold adjust mask and implantating impurities, then tunnel oxide layer 560 of the core memory cells and gate oxide layer 561 of the peripheral devices are formed, as by thermal oxidation at a temperature of about 1000° C. or higher, as shown in FIG. 5E. Referring to FIG. 5F, a first layer of polysilicon 570 ("the poly1 layer"), which, after a series of etching steps, will form the floating gates 250 of the memory cells 120 and a portion of the gates 290 of the select transistors 130, 140 and interconnects for select drain/source lines, is then deposited (step 460), as by low pressure chemical vapor deposition (LPCVD).

Figure 5G:
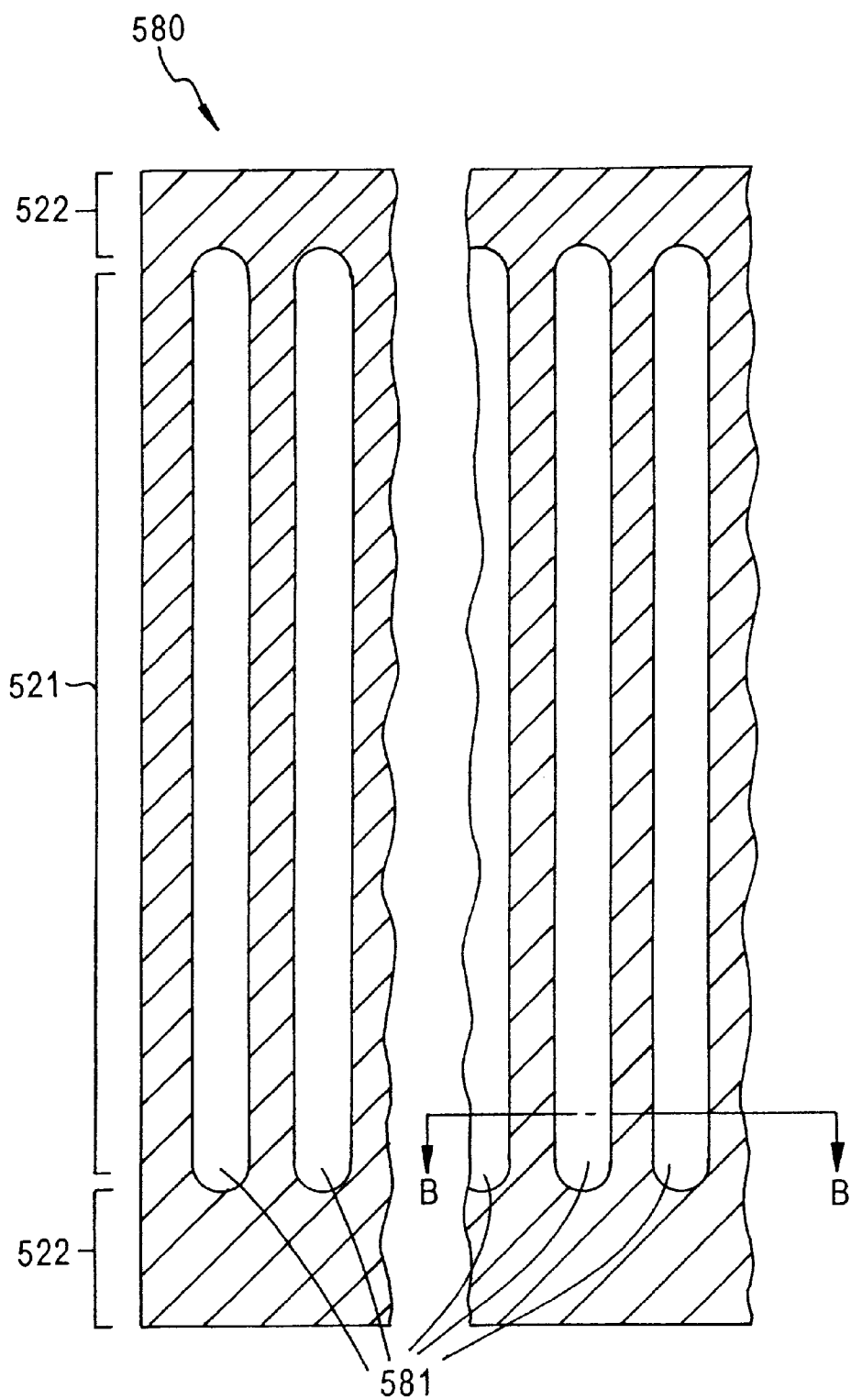
Figure 5H:
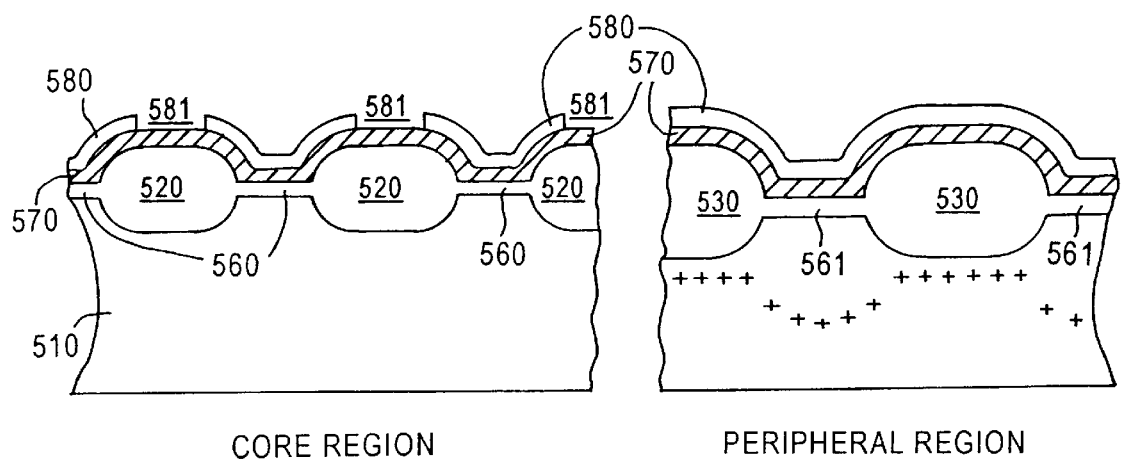
Figure 5I:
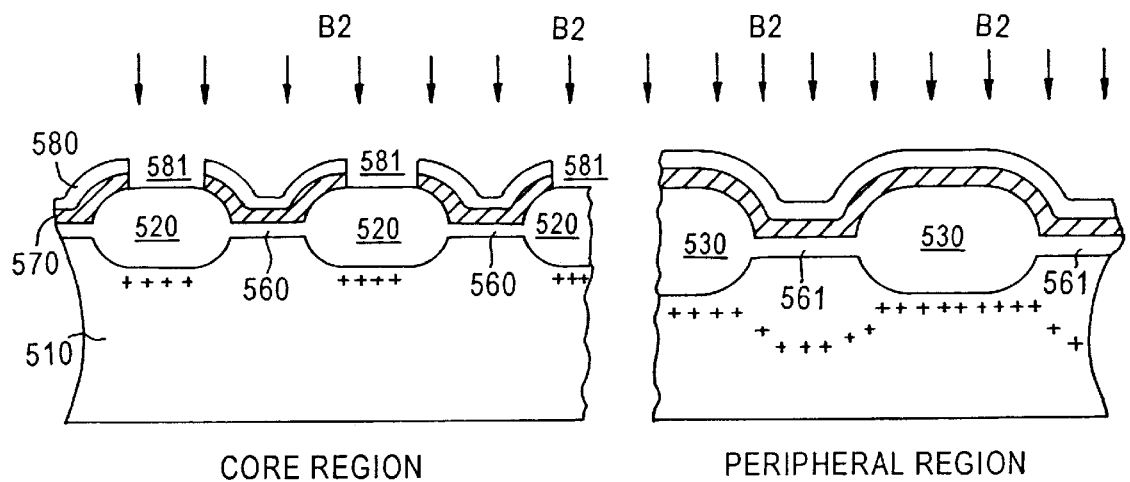

Referring now to FIG. 5G and FIG. 5H, which is a cross-sectional view taken through line B—B, photoresist mask 580 is thereafter formed with openings 581 to expose portions of poly1 layer 570 above the field oxide 520 of the memory cell area 521 (step 470). An etch of the poly1 layer 570 is then performed (step 480), and as depicted in FIG. 5I, an implant B2, such as boron at a dosage of about $10^{13}$ atoms cm$^{-2}$ and at an energy of about 50–80 keV, called a channel stop implant, is introduced into the core region at step 490 using mask 580, to optimize the core field isolation without the need to perform additional masking.

Thus, both the core memory cell area 521 and the select transistor areas 522 receive isolation implants: the memory cell area from channel stop implant B2, and the select transistor areas 522 from high-energy implant B1. Openings 552 in high-energy implant mask 550 are sized such that the highenergy implant B1 slightly overlaps the portion of core field oxide 520 covered by the channel stop implant B2, to ensure that there is no part of core field oxide 520 which does not receive any implant.

Figure 2A:
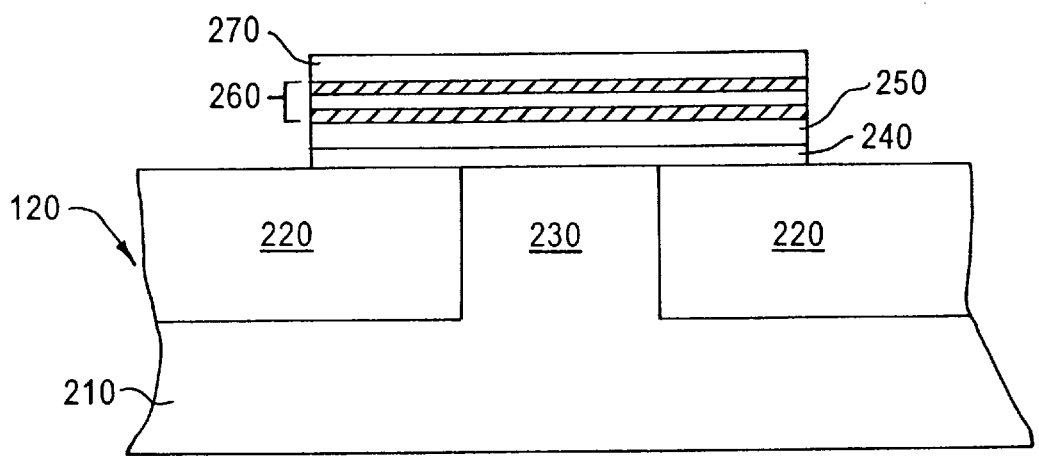
FIG. 2A is a cross-sectional view of a floating gate memory cell.
Figure 2B:
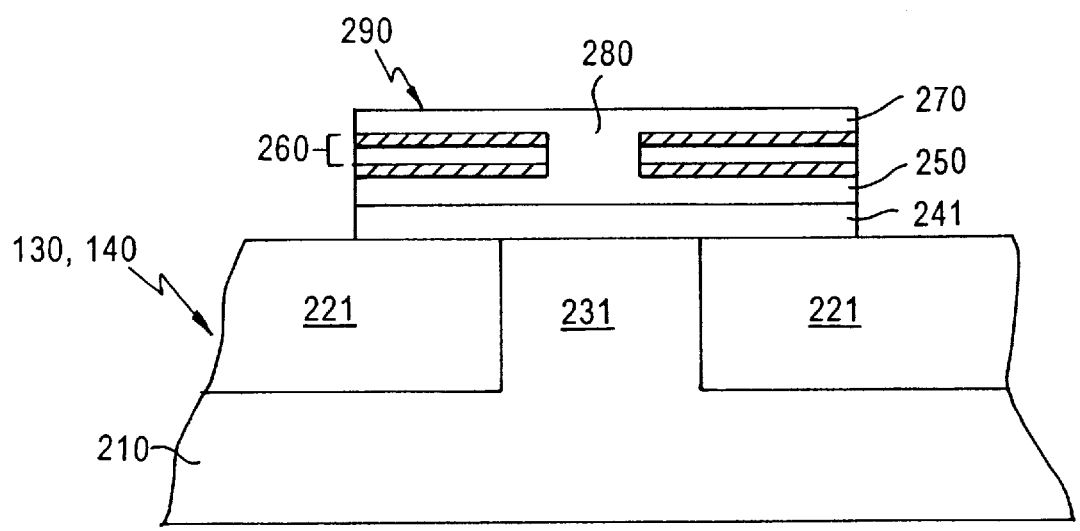
FIG. 2B is a cross-sectional view of a select transistor.
Figure 3A:
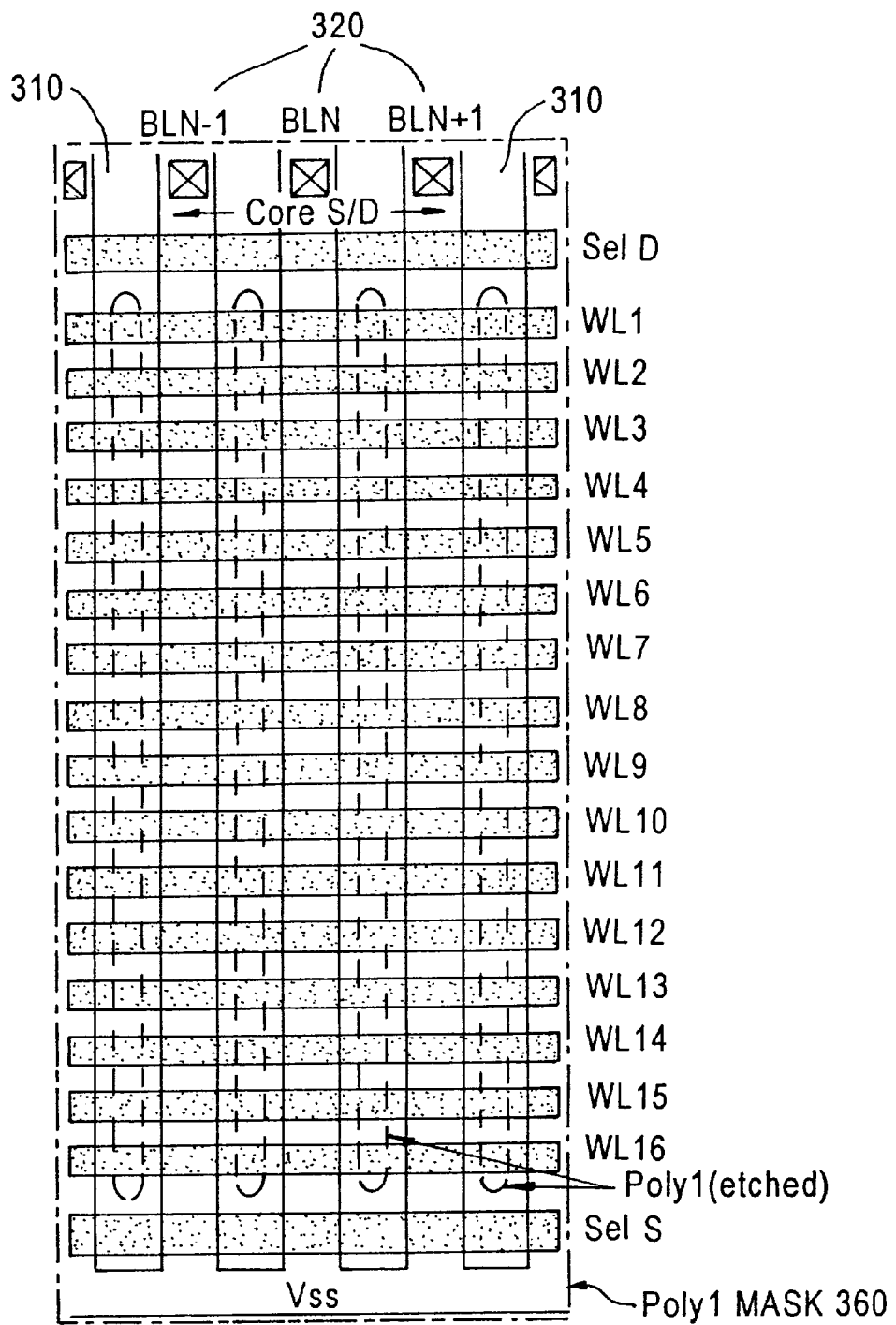
FIG. 3A is a plan view of the core area of a NAND flash memory system.
Figure 3B:
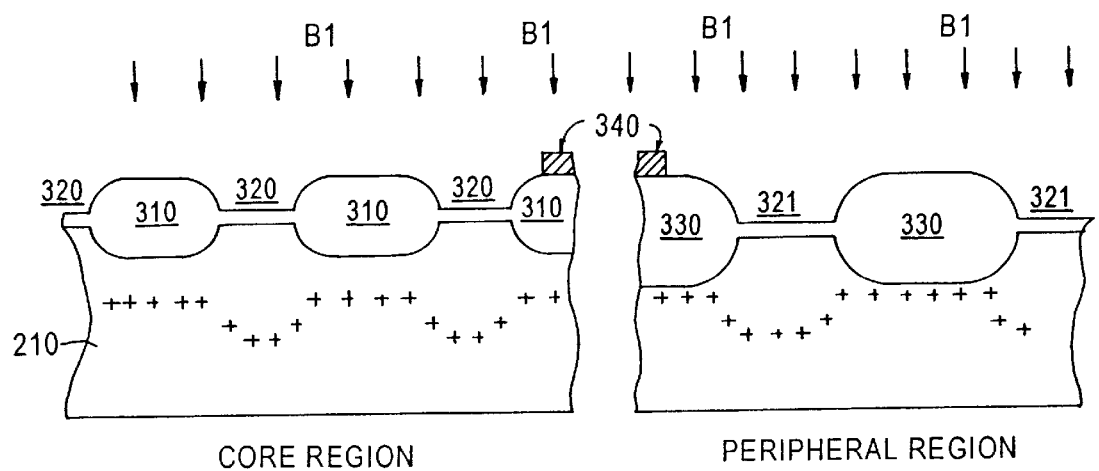
FIGS. 3B and 3C illustrate sequential phases in the formation of a conventional NAND flash memory system.
Figure 3C:
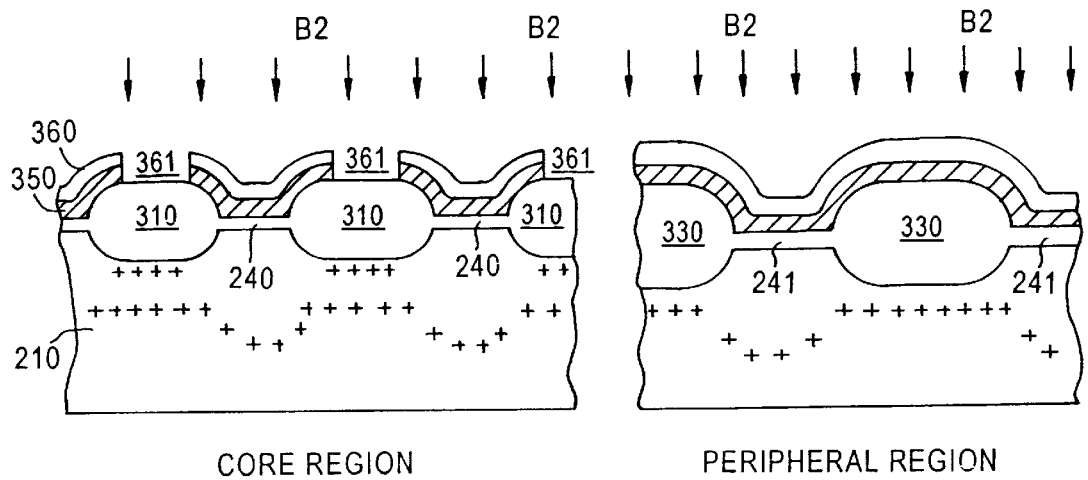

In subsequent processing steps (not shown), a dielectric layer (reference numeral 260 in FIGS. 2A and 2B) is deposited, masked and etched, followed by deposition of a second polysilicon layer ("the poly2 layer"), which is masked and etched to form control gates 270/word lines WL1–WL16, the SELD line and the SELS line. At the same time the poly2 layer is etched, poly1 layer 570 is further etched in core memory cell area 521 to complete formation of floating gates 250.

Figure 6:
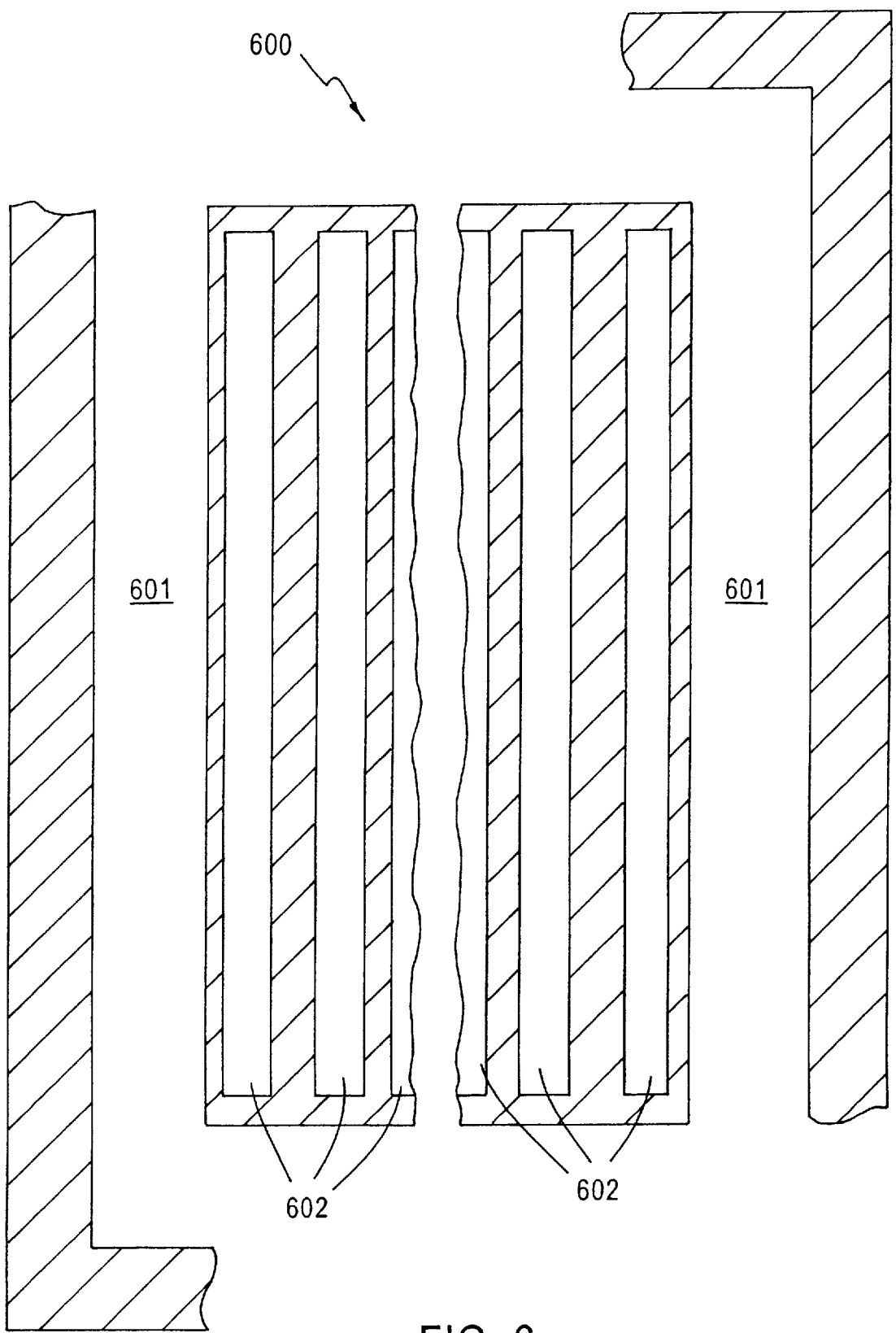
FIG. 6 is a plan view of a mask in accordance with an embodiment of the present invention.

FIG. 6 illustrates a mask 600 used for the high-energy implant B1 in another embodiment of the invention, the methodology of which is otherwise identical to that of the embodiment described above. In the FIG. 6 embodiment, mask 600 covers most of core field oxide 520, including memory cell channel regions 540, and has openings 601 exposing peripheral field oxide 530 and openings 602 exposing the entire rows of core field oxide 520, rather than only the distal end portions of the rows, as in the previously described embodiment (see FIG. 5C, mask 550). This embodiment advantageously facilitates forming mask 600 vis-à-vis mask 550 of the FIG. 5A–FIG. 5I embodiment, since openings 602 need not be sized to ensure overlap with the channel stop implant. However, when employing the methodology of the FIG. 6 embodiment, the dosage of the high-energy implant B1 should be controlled to ensure that the core field performance is not adversely affected by the presence of excessive dopant.

Figure 7:
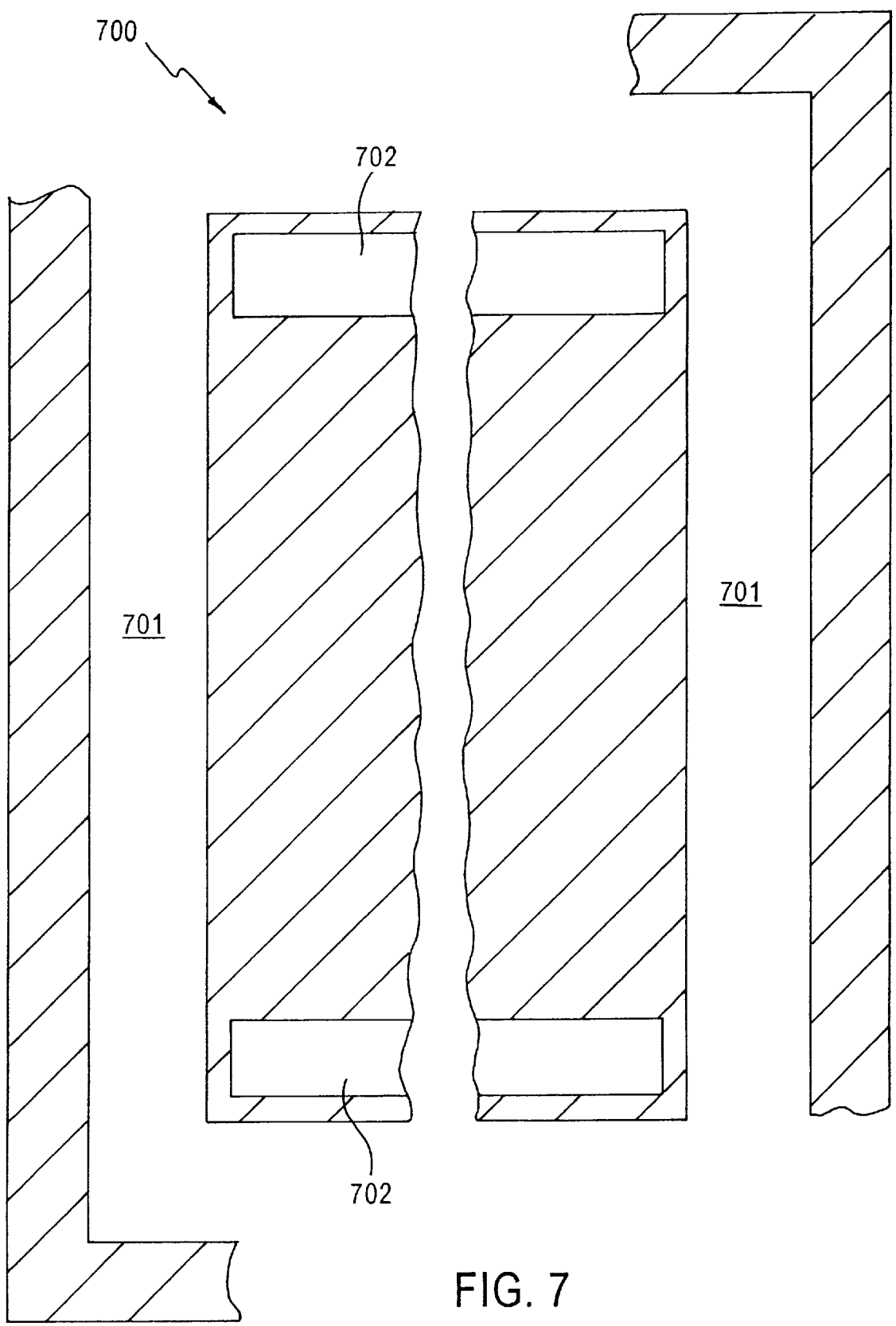
FIG. 7 is a plan view of a mask in accordance with an embodiment of the present invention.

FIG. 7 illustrates a mask 700 used for the high-energy implant B1 in a further embodiment of the invention, the methodology of which is otherwise identical to that of the embodiment described above. In the FIG. 7 embodiment, mask 700 covers most of core field oxide 520, and has peripheral openings 701 to expose peripheral field oxide 530 and upper and lower openings 702 extending across the rows of oxide 520 to expose selected portions of the core field oxide 520 corresponding to the select transistor areas 522; i.e., the distal end portions of each of the rows of core field oxide 520.

This embodiment advantageously facilitates forming mask 700 vis-à-vis mask 550 of the FIG. 5A–FIG. 5I embodiment, which exposes only the distal end portions of the rows, and mask 600 of FIG. 6, which exposes the entire rows of core field oxide 520, because masks 550 and 600 are "critical masks" not required by conventional isolation techniques; i.e., masks which are difficult to make and must be precisely aligned to yield acceptable results. Since each opening 702 in mask 700 exposes a distal end region 522 of every core oxide row 520, as well as portions 545 of the core channel region 540 disposed between core field oxide rows 520, mask 700 does not need to be precisely sized and aligned to expose only the core oxide. However, since upper and lower openings 702 extend across the rows of oxide 520, portions 545 of memory core channel areas 540 will also be exposed to implant B1. The implant B1 in channel areas 545 may slightly increase the threshold voltage of select transistors 130 over select transistors formed by conventional isolation processes, due to higher effective channel doping concentration. Therefore, the dosage of implant B1 should be controlled to insure that the select transistor performance is not adversely affected by excessive dopant.

In the embodiment of FIG. 4 and FIGS. 5A–5I, the high-energy implant B1 drives the impurities relatively deep into substrate 510 in order to optimize peripheral field isolation, and the impurities are driven even deeper into substrate 510 during the formation of tunnel oxide 560 and gate oxide 561, which typically takes place at temperatures in excess of 1000° C., as explained above. As a result, only a fraction of the impurities in select transistor areas 522 remain in an optimal location immediately below core field oxide 520. Thus, isolation of select transistor areas 522 is not entirely effective, which can cause current leakage between bit lines BL1–BLn during programming (see FIG. 1). In another embodiment of the invention, the high-energy implantation is performed after the hightemperature formation of gate oxide 560 and tunnel oxide 561. Thus, the field isolation doping concentration under core field oxide 520 in select transistor areas 522 is not significantly decreased by a thermal drive cycle, resulting in more effective isolation of select transistor areas 522.

Figure 8:
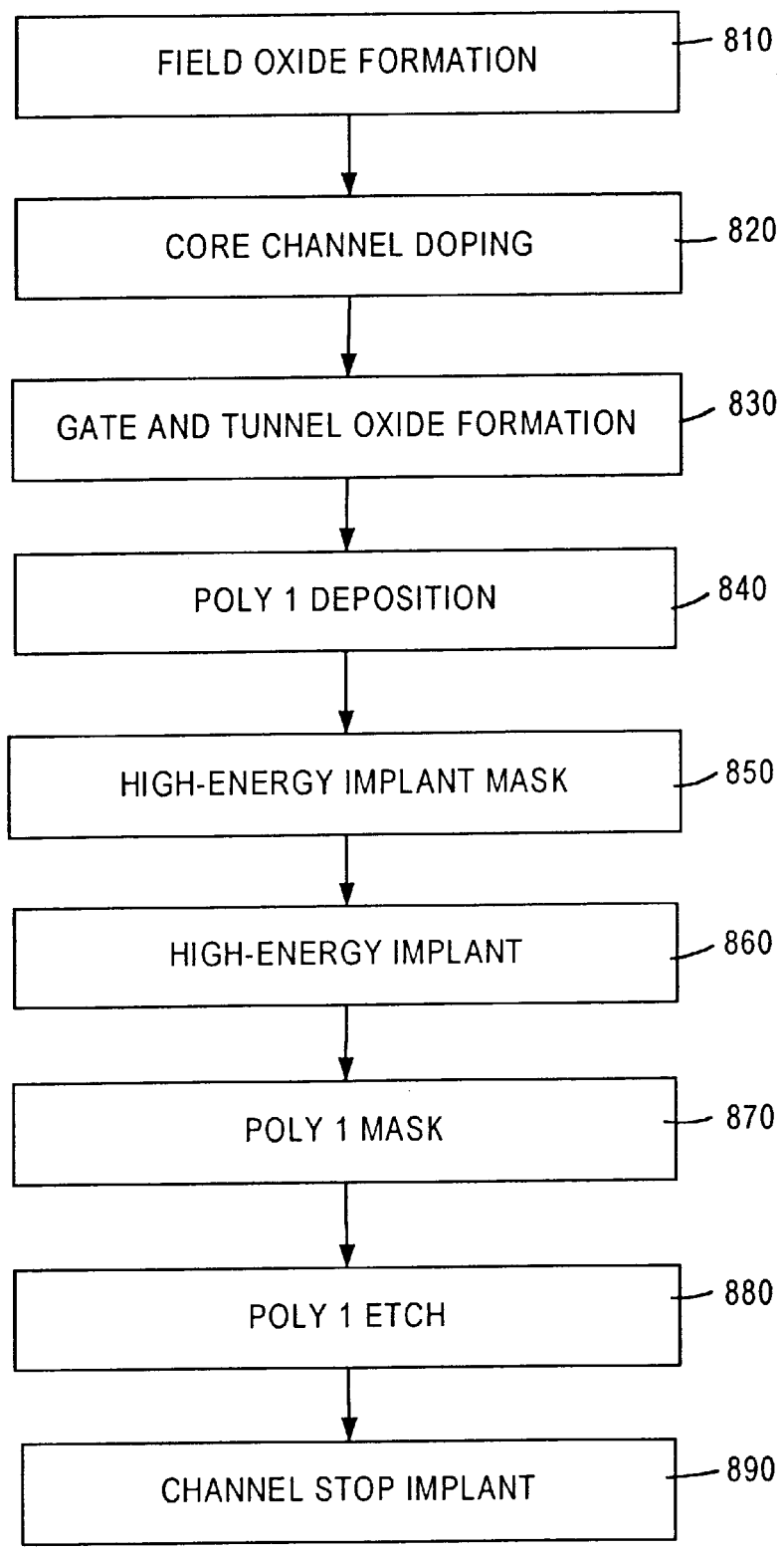
FIG. 8 is a flow chart illustrating sequential steps of a method in accordance with an embodiment of the present invention.
Figure 9A:
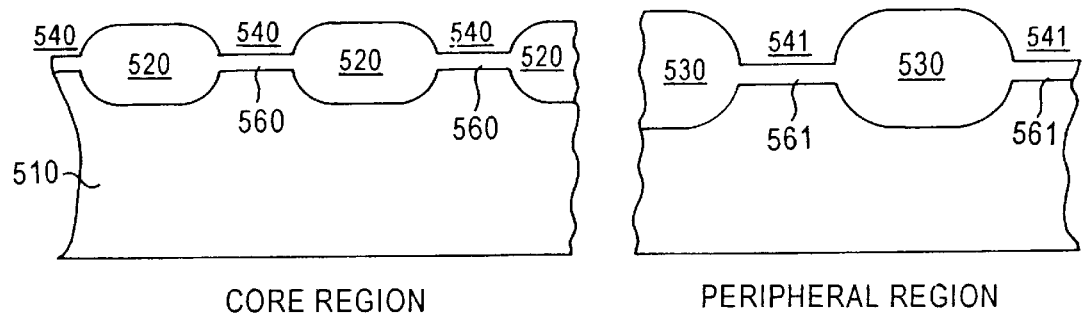
FIGS. 9A–9C schematically illustrate sequential phases of a method in accordance with an embodiment of the present invention.
Figure 9B:
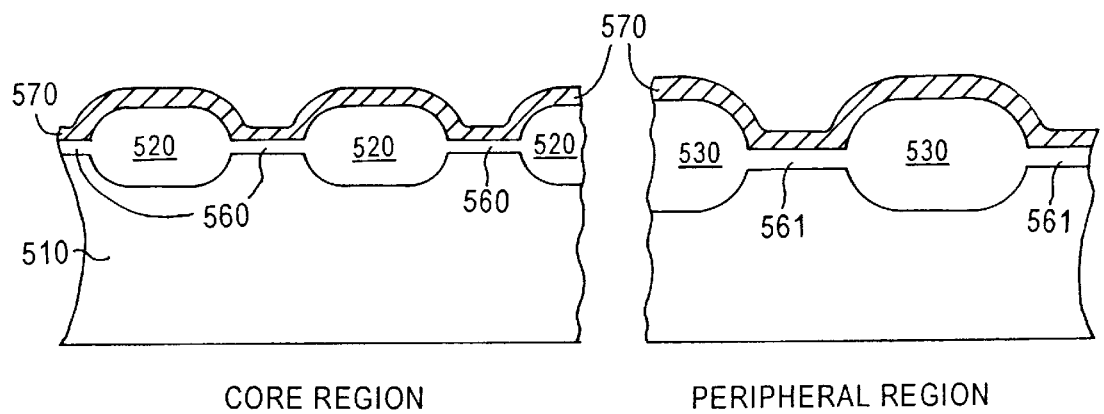
Figure 9C:
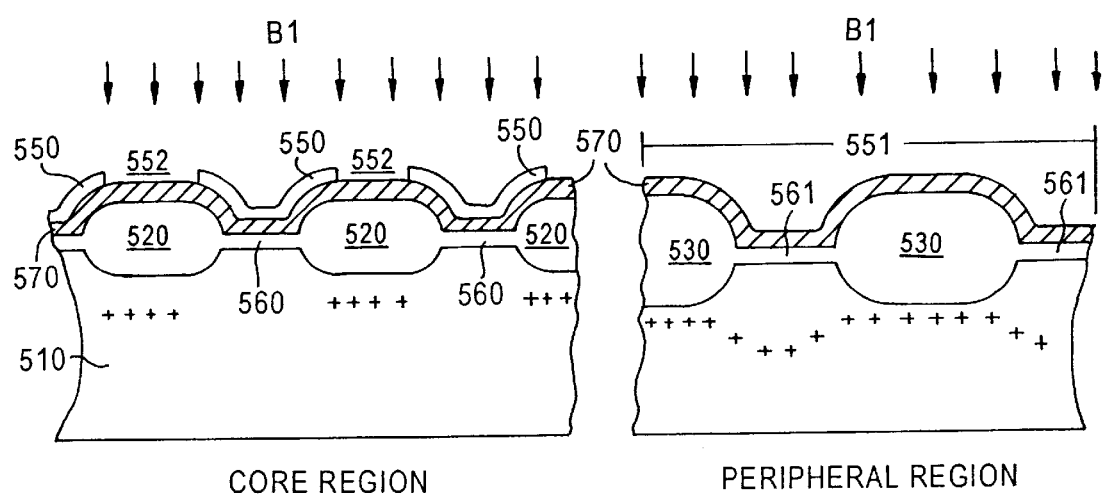

FIG. 8 is a flow chart illustrating sequential steps of a method in accordance with this embodiment of the present invention, and FIGS. 9A–9C schematically illustrate sequential phases of a method in accordance with an embodiment of the present invention. At step 810, field isolation regions 520, 530 in the form of parallel rectangular rows, are formed in substrate 510 for the memory core and for peripheral circuitry, as described with reference to FIGS. 5A–5B above.

Next, core channel regions (not shown) in substrate 510 are thereafter doped at step 820 by implantation of impurities, then tunnel oxide layer 560 of the core memory cells and gate oxide layer 561 of the peripheral devices are formed (step 830), as by thermal oxidation at a temperature of about 1000° C. or higher, as shown in FIG. 9A. Referring to FIG. 9B, poly1 layer 570 is then deposited (step 840), as by low pressure chemical vapor deposition (LPCVD).

At step 850, a photoresist mask identical to mask 550 depicted in FIG. 5C is formed on poly1 layer 570. As shown in FIG. 9C, which is a cross-sectional view taken through the line A—A in FIG. 5C, mask 550 covers most of poly1 layer 570 corresponding to core field oxide 520, and has openings 551, as described above, corresponding to peripheral field oxide 530 and openings 552 corresponding to select transistor areas 522; i.e., the distal end portions of each of the rows of core field oxide 520. High-energy implant B1 is then performed (step 860), such as boron at a dosage of about $3 \times 10^{12}$ atoms $cm^{-2}$ to about $7 \times 10^{12}$ atoms $cm^{-2}$ at an energy of about 130 keV to about 180 keV; e.g., a dosage of about $5 \times 10^{12}$ atoms $cm^{-2}$ at an energy of about 150 keV, to optimize the peripheral field isolation and to enhance isolation at the select transistor areas 522.

Next, poly1 layer 570 is masked at step 870, etched at step 880, and channel stop implant B2 is performed at step 890, as described with reference to FIGS. 5G, 5H and 5I. The methodology of this embodiment of the present invention provides improved isolation in the select transistor areas 522 vis-a-vis that provided by the methodology of the embodiment of FIG. 4 and FIGS. 5A–5I, by performing the high-energy implant B1 after the thermal growth of tunnel oxide 550 and gate oxide 551, thereby improving the performance of the finished device.

In an alternative embodiment of the inventive methodology of FIG. 8 and FIGS. 9A–9C, a mask similar to mask 600 described above with reference to FIG. 6 is employed instead of mask 550 for high-energy implant B1. The methodology of this embodiment is otherwise identical to that of the embodiment described with reference to FIG. 8 and FIGS. 9A–9C. As explained above with reference to FIG. 6, mask 600 is easier to form than mask 550, since openings 602 need not be sized to ensure overlap with the channel stop implant.

In another alternative embodiment of the inventive methodology of FIG. 8 and FIGS. 9A–9C, a mask similar to mask 700 described above with reference to FIG. 7 is employed for high-energy implant B1. The methodology of this embodiment is otherwise identical to that of the embodiment described with reference to FIG. 8 and FIGS. 9A–9C. As explained with reference to FIG. 7, mask 700 is easier to form than masks 550 and 600, since mask 700 does not need to be precisely sized and aligned to expose only the core oxide; i.e., mask 700 is not a critical mask.

In the above-described embodiment of FIG. 8 and FIGS. 9A–9C, high-energy implant B1 is performed after the high-temperature gate and tunnel oxide formation; therefore, the field isolation doping concentration under core field oxide 520 in select transistor areas 522 is not significantly decreased by a thermal drive cycle, resulting in more effective isolation of select transistor areas 522. However, since high-energy implant B 1 is performed at an energy to ensure optimization of peripheral field isolation 530, and field oxide 520 in select transistor areas 522 is not as thick as peripheral field oxide 530, the high-energy implantation of this methodology nevertheless drives the impurities too deep into substrate 510 to optimize isolation of select transistor areas 522. Thus, bit line leakage and program disturb may still occur due to lack of isolation optimization of select transistor areas 522, especially as circuit density is increased.

In another embodiment of the present invention, high-energy implant B1 is performed after poly1 layer 570 and a dielectric layer have been deposited on select transistor areas 522, and have been removed from the peripheral circuit areas. Thus, the dopant is implanted through a dielectric/polysilicon/core field oxide stack in select transistor areas 522, and through only peripheral field oxide 530 in the peripheral circuit areas. Since the dielectric/polysilicon/core field oxide stack has about the same effective thickness as peripheral field oxide 530, both the select transistor and the peripheral field isolations can be advantageously optimized with a single implantation step. Thus, core and peripheral field isolations and select transistor isolation are advantageously optimized.

Figure 10:
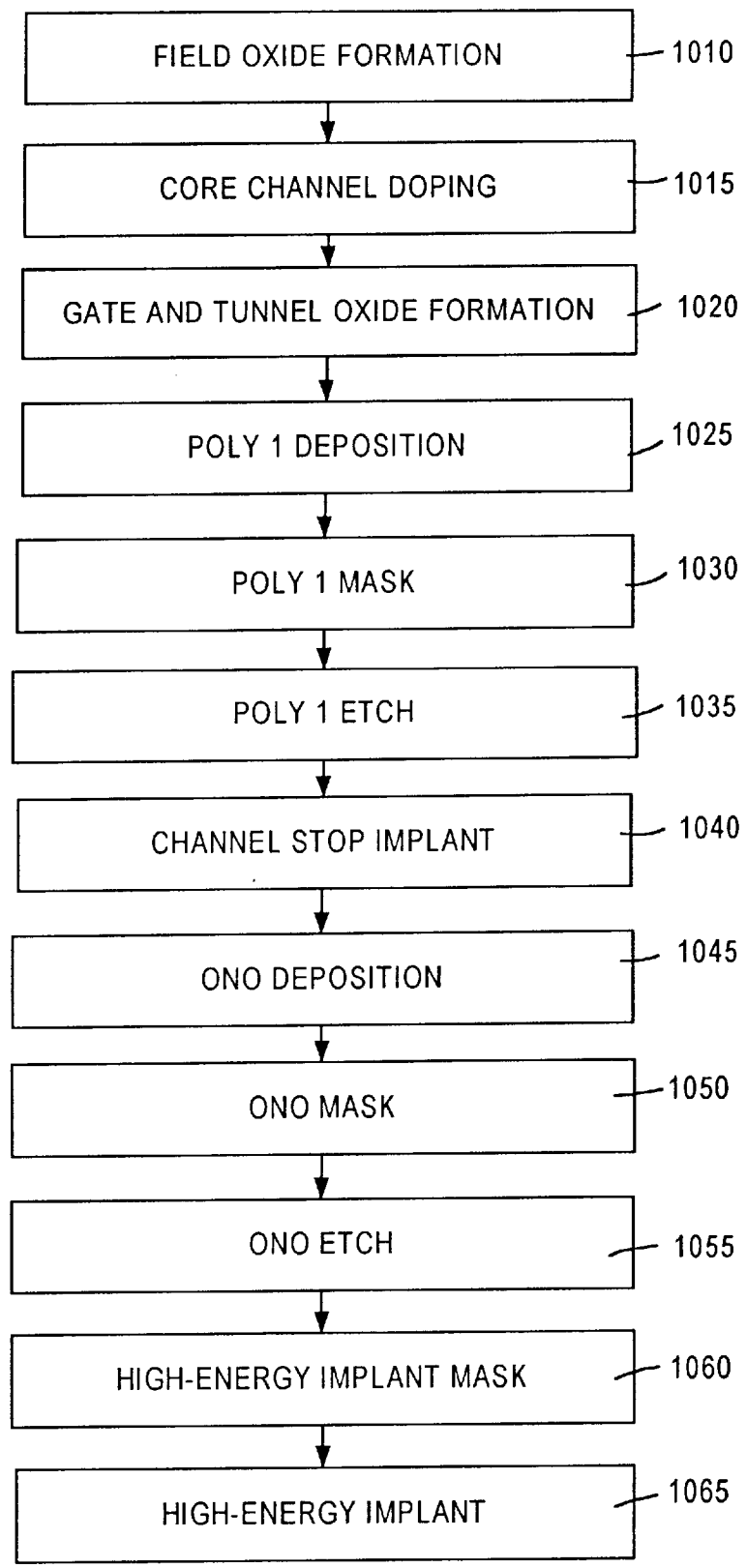
FIG. 10 is a flow chart illustrating sequential steps of a method in accordance with an embodiment of the present invention.

FIG. 10 is a flow chart illustrating sequential steps of a method in accordance with this embodiment of the present invention, and FIGS. 11A–11D schematically illustrate sequential phases of a method in accordance with an embodiment of the present invention. At step 1010, field isolation regions 520, 530 in the form of parallel rectangular rows are formed in substrate 510 for the memory core and for peripheral circuitry, as described above with reference to FIGS. 5A–5B. Core channel regions (not shown) in substrate 510 are thereafter doped at step 1015 by implantation of impurities, tunnel oxide layer 560 of the core memory cells and gate oxide layer 561 of the peripheral devices are formed (step 1020), and poly1 layer 570 is then deposited (step 1025), as described above with reference to FIGS. 9A–9B.

Figure 11A:
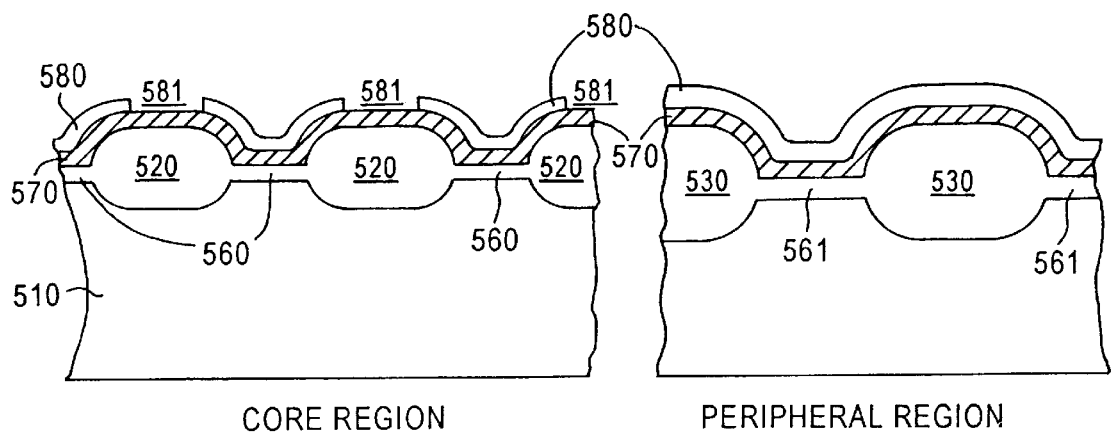
FIGS. 11A–11D schematically illustrate sequential phases of a method in accordance with an embodiment of the present invention.
Figure 11B:
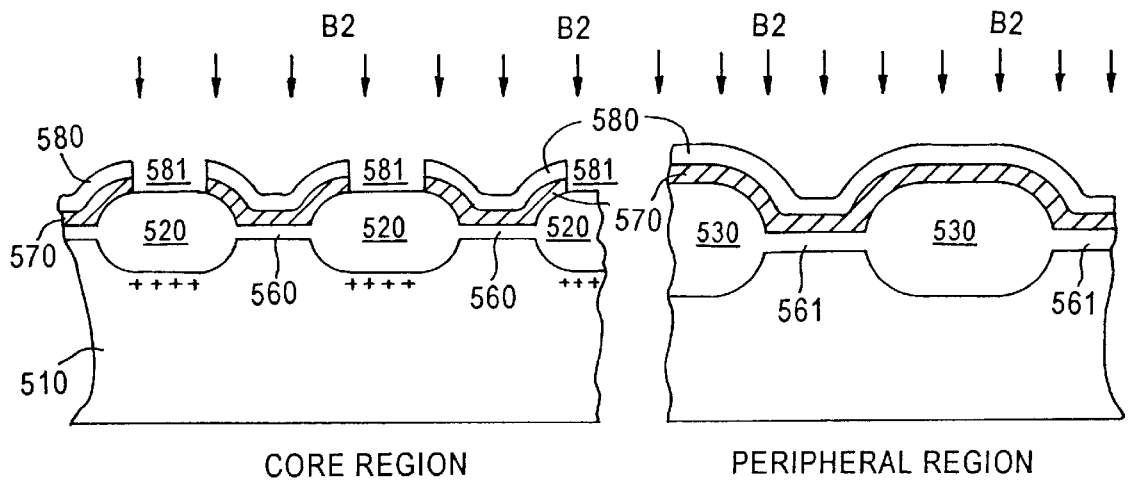

Next, a photoresist mask identical to mask 580 depicted in FIG. 5G is formed on poly1 layer 570. As shown in FIG. 11A, which is a cross-sectional view taken through the line B—B in FIG. 5G, photoresist mask 580 is formed with openings 581 to expose portions of poly1 layer 570 above field oxide 520 of memory cell area 521. An etch of poly1 layer 570 is then performed (step 1035), and as depicted in FIG. 11B, channel stop implant B2 (i.e., boron at a dosage of about $2 \times 10^{13}$ atoms $cm^{-2}$ to about $6 \times 10^{13}$ atoms $cm^{-2}$ at an energy of about 50 keV to about 80 keV, e.g., a dosage of about $4 \times 10^{13}$ $cm^{-2}$ at an energy of about 65 keV), is thereafter introduced into the core region at step 1040 using mask 580, to optimize the core field isolation without the need to perform additional masking.

Figure 11C:
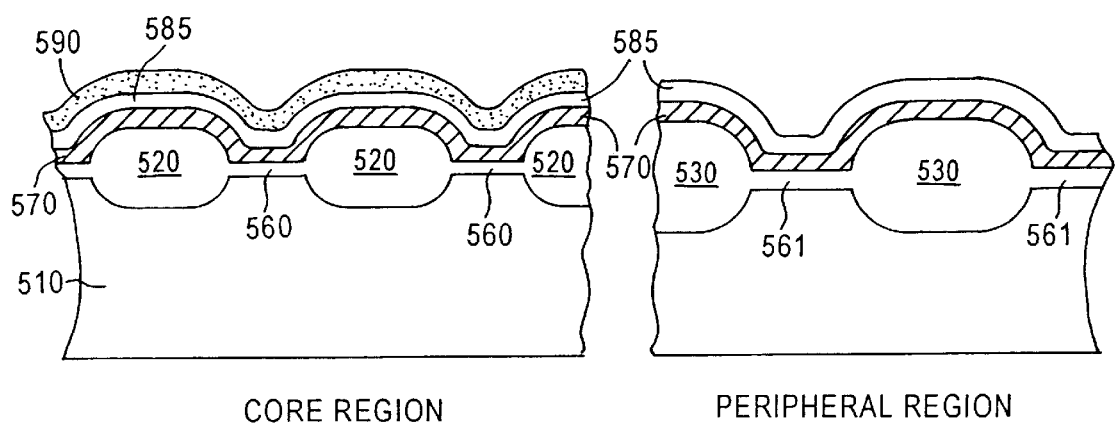

Referring now to FIG. 11C, which is a cross-sectional view taken through the select transistor area 522, a dielectric layer 585 (reference numeral 260 in FIGS. 2A and 2B) is deposited over polysilicon layer 570 in step 1045. Dielectric layer 585 can comprise any dielectric material or composite conventionally employed for interpoly dielectric layers, such as an "ONO layer" comprising a three-layer stack of a silicon dioxide layer, a silicon nitride layer, and another silicon dioxide layer, and typically has a total thickness of about 180 Å to about 280 Å. At step 1050, dielectric layer 585 is masked by photoresist mask 590 in the entire core region and etched to remove both dielectric layer 585 and polysilicon layer 570 in the peripheral region (see step 1055).

Figure 11D:
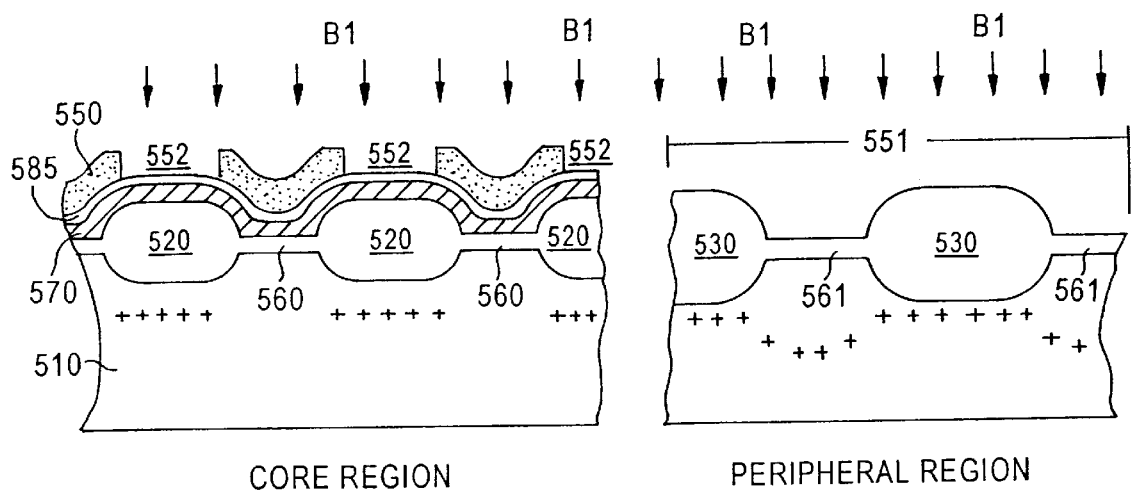

Photoresist mask 590 is then removed, and another photoresist mask, identical to mask 550 depicted in FIG. 5C, is formed on dielectric layer 585 (see step 1060). AS depicted in FIG. 11D, which 20 is a cross-sectional view taken through line A—A in FIG. 5C, mask 550 covers most of dielectric layer 585 corresponding to core field oxide 520, and has openings 551 corresponding to peripheral field oxide 530 and openings 552 corresponding to select transistor areas 522; i.e., the distal end portions of each of the rows of core field oxide 520. High-energy implant B1 is then performed (step 1065), such as boron at a dosage of about $3 \times 10^{12}$ atoms cm$^{-2}$ to about $7 \times 10^{12}$ atoms cm$^{-2}$ at an energy of about 110 keV to about 160 keV; e.g., a dosage of about $5 \times 10^{12}$ atoms cm$^{-2}$ at an energy of about 135 keV.

Thus, both core memory cell area 521 and select transistor areas 522 receive isolation implants: the memory cell area from channel stop implant B2, and the select transistor areas 522 from high-energy implant B1. Openings 552 in high-energy implant mask 550 are sized such that the high-energy implant B1 slightly overlaps the portion of core field oxide 520 covered by the channel stop implant B2, to ensure that there is no part of core field oxide 520 which does not receive any implant.

The thicknesses of the deposited core field oxide 520, polysilicon layer 570, dielectric layer 585 and peripheral field oxide 530 are chosen such that peripheral field oxide 530 has a thickness about equal to the sum of the thicknesses of core field oxide 520, polysilicon layer 570 and dielectric layer 585; e.g., peripheral field oxide 530 having a thickness of about 3800 Å, core field oxide 520 having a thickness of about 2500 Å, polysilicon layer 570 having a thickness of about 1000 Å, and dielectric layer 585 having a thickness of about 200 Å. As a result, high-energy implant B1 optimizes both the peripheral field isolation and the isolation of select transistor areas 522, since impurities B1 are driven through approximately the same thickness of materials in the core region and the peripheral region.

In subsequent processing steps (not shown), the poly2 layer is deposited, masked and etched to form control gates 270/word lines WL1–WL16, the SELD line and the SELS line. At the same time the poly2 layer is etched, poly1 layer 570 is further etched in core memory cell area 521 to complete formation of floating gates 250.

In an alternative embodiment of the inventive methodology of FIG. 10 and FIGS. 11A–11D, a mask similar to mask 600 described above with reference to FIG. 6 is employed instead of mask 550 for high-energy implant B1. The methodology of this embodiment is otherwise identical to that of the embodiment described with reference to FIG. 10 and FIGS. 11A–11D. As explained above with reference to FIG. 6, mask 600 is easier to make than mask 550, since openings 602 need not be sized to ensure overlap with the channel stop implant.

In another alternative embodiment of the inventive methodology of FIG. 10 and FIGS. 11A–11D, a mask similar to mask 700 described above with reference to FIG. 7 is employed for high-energy implant B1. The methodology of this embodiment is otherwise identical to that of the embodiment described with reference to FIG. 10 and FIGS. 11A–11D. As explained with reference to FIG. 7, mask 700 is easier to make than masks 550 and 600, since mask 700 does not need to be precisely sized and aligned to expose only the core oxide; i.e., mask 700 is not a critical mask.

The inventive methodology provides several technological advantages over conventional field isolation formation techniques, which technological advantages are gained without adding any process steps to conventional methodology. For example, by masking the memory cell core area 521 from the high-energy implant B1 used to optimize the peripheral field isolation, deep and heavy doping of the memory cell core area 521 is avoided, thereby avoiding degradation of self-boosting efficiency attendant upon conventional methodology. In addition, by selectively doping the core field oxide in the select transistor areas 522 with high-energy implant B1, isolation in this area is enhanced.

Select transistor areas 522 would not otherwise be implanted because the only other core field implantation step is the channel stop implant B2, and this implant B2 does not reach these areas because, as shown, for example, in FIG. 5G, poly1 layer 570 is not etched in areas 522 between the first word line WL1 and the gate of the select transistor SELD, and between the last word line WL16 and the gate of the select transistor SELS; i.e., mask 580 covers these areas 522. Poly1 layer 570 is not etched in areas 522 because poly1 layer 570 serves as an interconnect between the gates of the select transistors 130, 140 to form the SELD and SELS lines.

The lack of a channel stop implant B2 under core field oxide 520 at areas 522 would cause problems when the flash memory device is being programmed, if no other implant was provided in areas 522. During programming, a program voltage of as much as 20V is applied to a selected word line WL1–WL16 associated with a selected memory cell S to be programmed. At this high word line voltage, the isolation regions at areas 522 may "turn on" due to inadequate field isolation; i.e., current may flow between bit lines BL1–BLn. This is disadvantageous because during programming, the bit line BL1 associated with the selected memory cell S (BL1 is referred to as the "selected bit line") has 0 volts applied to it while the other bitlines (called "unselected bit lines") have a supply voltage Vsupp, such as about 3.3 volts, applied to them. If current leaks to the selected bit line BL1 from an adjacent unselected bit line, the memory device will malfunction. The inventive methodology avoids this problem by implanting impurities at the high-energy implant B1 into the portions of core field oxide 520 in areas 522 which do not receive channel stop implant B2.

The present invention enables optimization of both core and peripheral field isolations without substantially degrading self-boosting efficiency or otherwise increasing program disturb, thereby improving device performance and reliability. The present invention is applicable to the manufacture of various types of semiconductor devices, particularly high-density semiconductor devices having a design rule of about 0.25 μ and under; e.g., about 0.18 μm and under.

The present invention can be practiced employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:
    forming a memory core region on a semiconductor substrate. the memory core region comprising a core field oxide and memory cell channel areas;
    forming a peripheral field oxide in a peripheral region on the semiconductor substrate peripheral to the memory core region;
    providing a single implant blocking mask covering the memory cell channel areas and having openings exposing the peripheral field oxide and predetermined portions of the core field oxide; and
    implanting impurities into the substrate through the openings in the implant blocking mask to improve field isolation.

2. The method according to claim 1, comprising forming the core field oxide and the peripheral field oxide by local oxidation of silicon (LOCOS).

3. The method according to claim 2, comprising forming the core field oxide as a plurality of substantially parallel, substantially rectangular oxide rows defining a central memory cell area and defining a select transistor area at each distal end portion of each row.

4. The method according to claim 3, wherein the predetermined portions of the core field oxide are the distal end portions of each of the rows corresponding to the select transistor areas.

5. The method according to claim 3, wherein the predetermined portions of the core field oxide comprise the plurality of rows.

6. The method according to claim 3, wherein the openings in the implant blocking mask exposing the predetermined portions of the core field oxide comprise an upper opening extending across the plurality of core field oxide rows and exposing the select transistor areas at the upper distal end portions of the plurality of core field oxide rows, and a lower opening extending across the plurality of core field oxide rows exposing the select transistor areas at the lower distal end portions of the plurality of core field oxide rows.

7. The method according to claim 6, wherein the upper and lower openings of the implant blocking mask are substantially rectangular.

8. The method according to claim 2, wherein the peripheral field oxide has a thickness of about 4000 Å to about 6000 Å and the core field oxide has a thickness of about 2000 Å to about 3000 Å.

9. The method according to claim 8, comprising implanting boron at a dosage of about $3 \times 10^{12}$ atoms $cm^{-2}$ to about $7 \times 10^{12}$ atoms $cm^{-2}$ and at an energy of about 120 keV to about 180 keV.

10. The method according to claim 9, comprising implanting boron at a dosage of about $5 \times 10^{12}$ atoms $cm^{-2}$ and at an energy of about 150 keV.

11. The method according to claim 3, comprising:
    forming a tunnel oxide layer on portions of the memory cell area;
    forming a gate oxide layer on portions of the select transistor areas;
    depositing a polysilicon layer on the memory cell area and the select transistor areas;
    providing a second mask on the polysilicon layer having openings corresponding to the core oxide in the memory cell area;
    etching to expose the core oxide in the memory cell area; and
    implanting impurities through the exposed core oxide into the substrate to improve field isolation.

12. The method of claim 11, comprising forming the tunnel oxide layer and the gate oxide layer by thermal oxidation at a temperature of about 1000° C. or higher.

13. The method according to claim 11, comprising implanting boron at a dosage of about $2 \times 10^{13}$ atoms $cm^{-2}$ to about $6 \times 10^{13}$ atoms $cm^{-2}$ and at an energy of about 50 keV to about 80 keV.

14. The method according to claim 13, comprising implanting boron at a dosage of about $4 \times 10^{13}$ atoms $cm^{-2}$ and at an energy of about 65 keV.

15. The method according to claim 1, comprising depositing a polysilicon layer on the memory core region and the peripheral region, prior to providing the implant blocking mask.

16. The method according to claim 15, comprising forming the core field oxide as a plurality of substantially parallel, substantially rectangular oxide rows defining a central memory cell area and defining a select transistor area at each distal end portion of each row.

17. The method according to claim 16, comprising:
    forming a tunnel oxide layer on portions of the memory cell area prior to depositing the polysilicon layer;
    forming a gate oxide layer on portions of the select transistor areas prior to depositing the polysilicon layer;
    providing a second mask on the polysilicon layer after the implanting step, the second mask having openings corresponding to the core oxide in the memory cell area;
    etching to expose the core oxide in the memory cell area; and
    implanting impurities through the exposed core oxide into the substrate to improve field isolation.

18. The method according to claim 1, comprising depositing a polysilicon layer on the memory core region and depositing a dielectric layer on the polysilicon layer, prior to providing the implant blocking mask.

19. A method of manufacturing a semiconductor device, which method comprises:
    forming a core field oxide in a memory core region on a semiconductor substrate;
    forming a peripheral field oxide in a peripheral region on the semiconductor substrate peripheral to the memory core region;
    providing an implant blocking mask covering the memory core region and having openings exposing the peripheral field oxide and predetermined portions of the core field oxide;
    depositing a polysilicon layer on the memory core region and depositing a dielectric layer on the polysilicon layer, prior to providing the implant blocking mask;

depositing the peripheral field oxide, the core field oxide, the polysilicon layer and the dielectric layer such that the peripheral field oxide has a thickness about equal to the sum of the thicknesses of the core field oxide, the polysilicon layer and the dielectric layer; and implanting impurities into the substrate through the openings in the implant blocking mask to improve field isolation.

20. The method according to claim 19, wherein the peripheral field oxide has a thickness of about 4000 Å to about 6000 Å, the core field oxide has a thickness of about 2000 Å to about 3000 Å, the polysilicon layer has a thickness of about 600 Å to about 1000 Å, and the dielectric layer has a thickness of about 180 Å to about 280 Å.

21. The method according to claim 20, wherein the peripheral field oxide has a thickness of about 3800 Å, the core field oxide has a thickness of about 2500 Å, the polysilicon layer has a thickness of about 1000 Å, and the dielectric layer has a thickness of about 200 Å.

22. The method according to claim 20, comprising implanting boron at a dosage of about $3\times10^{12}$ atoms $cm^{-2}$ to about $7\times10^{12}$ atoms $cm^{-2}$ and at an energy of about 110 keV to about 160 keV.

23. The method according to claim 22, comprising implanting boron at a dosage of about $5\times10^{12}$ atoms $cm^{-2}$ and at an energy of about 135 keV.

24. The method according to claim 18, comprising forming the core field oxide as a plurality of substantially parallel, substantially rectangular oxide rows defining a central memory cell area and defining a select transistor area at each distal end portion of each row.

25. The method according to claim 24, comprising:

forming a tunnel oxide layer on portions of the memory cell area prior to depositing the polysilicon layer;

forming a gate oxide layer on portions of the select transistor areas prior to depositing the polysilicon layer;

providing a first mask on the polysilicon layer prior to depositing the dielectric layer, the first mask having openings corresponding to the core oxide in the memory cell area;

etching to expose the core oxide in the memory cell area; and implanting impurities through the exposed core oxide into the substrate to improve field isolation.

26. The method according to claim 25, comprising:

depositing the polysilicon layer on the peripheral region;

depositing the dielectric layer on the polysilicon layer on the peripheral region;

providing a dielectric layer mask on the dielectric layer prior to providing the implant blocking mask, the dielectric layer mask having openings to expose the peripheral region; and etching to remove the dielectric layer and the polysilicon layer in the peripheral region prior to providing the implant blocking mask.

* * * * *

UNITED STATES PATENT AND TRADEMARK OFFICE
CERTIFICATE OF CORRECTION

PATENT NO. : 6,228,782 B1　　　　　　　　　　　　　　　　　　　　　Page 1 of 1
DATED : May 8, 2001
INVENTOR(S) : Hao Fang et al.

It is certified that error appears in the above-identified patent and that said Letters Patent is hereby corrected as shown below:

<u>Title page,</u>
Item [73], Assignee, add second assignee:

-- Fujitsu Ltd.,
　1-1, Kamikodanaka, 4-Chome
　Nakahara-Ku
　Kawasaki-Shi, Kanagawa 211-88
　JAPAN --

Signed and Sealed this

Fourth Day of May, 2004

JON W. DUDAS
*Acting Director of the United States Patent and Trademark Office*